(12) United States Patent
Klejsa et al.

(10) Patent No.: US 9,287,895 B2
(45) Date of Patent: *Mar. 15, 2016

(54) METHOD AND DECODER FOR RECONSTRUCTING A SOURCE SIGNAL

(71) Applicant: Huawei Technologies Co., Ltd., Shenzhen (CN)

(72) Inventors: Janusz Klejsa, Stockholm (SE); Guoqiang Zhang, Solna (SE); Minyue Li, Solna (SE); Willem Bastiaan Kleijn, Lower Hutt (NZ)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/751,359

(22) Filed: Jun. 26, 2015

(65) Prior Publication Data

US 2015/0295590 A1    Oct. 15, 2015

Related U.S. Application Data

(63) Continuation of application No. 14/087,080, filed on Nov. 22, 2013, now Pat. No. 9,100,053, which is a continuation of application No. PCT/CN2011/074508, filed on May 23, 2011.

(51) Int. Cl.
*H03M 7/40* (2006.01)
*H03M 7/30* (2006.01)
(Continued)

(52) U.S. Cl.
CPC .......... *H03M 7/4006* (2013.01); *H03M 7/3059* (2013.01); *H03M 7/40* (2013.01); *H03M 13/29* (2013.01); *H04B 1/04* (2013.01); *H04N 19/30* (2014.11); *H04N 19/44* (2014.11)

(58) Field of Classification Search
CPC ................................. H03M 7/30; H04N 19/30
See application file for complete search history.

(56) References Cited

U.S. PATENT DOCUMENTS

| 6,516,297 B1 | 2/2003 | Servetto et al. |
| 2004/0132416 A1 | 7/2004 | Yee et al. |

(Continued)

FOREIGN PATENT DOCUMENTS

| CN | 1630211 A | 6/2005 |
| CN | 1742457 A | 3/2006 |
| CN | 102263558 A | 4/2014 |

OTHER PUBLICATIONS

Vaishampayan, V., "Design of Multiple Description Scalar Quantizers," IEEE Transactions on Information Theory, vol. 39, No. 3, May 1993, pp. 821-834.

(Continued)

*Primary Examiner* — Howard Williams
(74) *Attorney, Agent, or Firm* — Conley Rose, P.C.; Grant Rodolph; Nicholas K. Beaulieu

(57) ABSTRACT

In a method for reconstructing a source signal, which is encoded by a set of at least two descriptions, the method comprises: receiving a subset of the set of descriptions; reconstructing a reconstructed signal at an operating bitrate of a set of operating bitrates upon the basis of the subset of descriptions, the reconstructed signal having a second probability density, wherein the second probability density comprises a first statistical moment and a second statistical moment; and manipulating the reconstructed signal, wherein the reconstructed signal is manipulated such that, irrespective of the operating bitrate, a predetermined minimum similarity between a first statistical moment of a third probability density and a first statistical moment of a first probability density and between a second statistical moment of the third probability density and a second statistical moment of the first probability density is maintained.

20 Claims, 5 Drawing Sheets

(51) Int. Cl.
H04N 19/33 (2014.01)
H04N 19/44 (2014.01)
H04B 1/04 (2006.01)
H03M 13/29 (2006.01)
H04N 19/30 (2014.01)

(56) References Cited

U.S. PATENT DOCUMENTS

2005/0213673 A1  9/2005  Paquelet et al.
2010/0215092 A1  8/2010  Kuropatwinski et al.
2010/0246686 A1  9/2010  Pezeshk et al.

OTHER PUBLICATIONS

Vaishampayan, et al., "Design of Entropy-Constrained Multiple-Description Scalar Quantizers," IEEE Transactions on Information Theory, vol. 40, No. 1, Jan. 1994, pp. 245-250.

Vaishampayan, et al., "Multiple-Description Vector Quantization with Lattice Codebooks: Design and Analysis," IEEE Transactions on Information Theory, vol. 47, No. 5, Jul. 2001, pp. 1718-1734.

Frank-Dayan, et al., "Dithered Lattice-Based Quantizers for Multiple Descriptions," IEEE Transactions on Information Theory, vol. 48, No. 1, Jan. 2002, pp. 192-204.

Tian, et al., "Universal Multiple Description Scalar Quantization: Analysis and Design," IEEE Transactions on Information Theory, vol. 50, No. 9, Sep. 2004, pp. 2089-2102.

Ostergaard, J., "n-Channel Entropy-Constrained Multiple-Description Lattice Vector Quantization," IEEE Transactions on Information Theory, vol. 52, No. 5, May 2006, pp. 1956-1973.

Huang, et al., "Optimal Index Assignment for Multiple Description Lattice Vector Quantization," Proceedings of the Data Compression Conference (DCC'06), 2006, 10 pages.

Klejsa, et al., "Adaptive Resolution-Constrained Scalar Multiple-Description Coding," IEEE International Conference on Acoustics, Speech & Signal Processing, Apr. 2008, pp. 2945-2948.

Li, et al., "Quantization with Constrained Relative Entropy and Its Application to Audio Coding," Presented at the 127th Convention, Oct. 9-12, 2009, 8 pages.

Klejsa, et al., "Flexcode—Flexible Audio Coding," Acoustics Speech and Signal Processing (ICASSP), 2010 IEEE International Conference, Mar. 14-19, 2010, pp. 361-364.

Li, et al., "Distribution Preserving Quantization With Dithering and Transformation," IEEE Signal Processing Letters, vol. 17, No. 12, Dec. 2010, pp. 1014-1017.

Ostergaard, et al., "n-Channel Asymmetric Entropy-Constrained Multiple-Description Lattice Vector Quantization," IEEE Transactions on Information Theory, vol. 56, No. 12, Dec. 2010, pp. 6354-6375.

Klejsa, J., "Multiple Description Distribution Preserving Quantization," IEEE Transactions on Signal Processing, vol. 61, No. 24, Dec. 15, 2013.

Foreign Communication From a Counterpart Application, European Application No. 11866073.7, Summons to Attend Oral Proceedings dated Aug. 11, 2015, 9 pages.

Office Action dated Dec. 3, 2014, U.S. Appl. No. 14/087,080, filed Nov. 22, 2013, 12 pages.

Partial English Translation and Abstract of Chinese Patent Application No. CN102263558A, Aug. 20, 2015, 4 pages.

Foreign Communication From a Counterpart Application, European Application No. 11866073.7, Extended European Search Report dated Apr. 22, 2014, 9 pages.

Foreign Communication From a Counterpart Application, PCT Application No. PCT/CN2011/074508, International Search Report dated Mar. 1, 2012, 6 pages.

Foreign Communication From a Counterpart Application, PCT Application No. PCT/CN2011/074508, Written Opinion dated Mar. 1, 2012, 4 pages.

METHOD AND DECODER FOR RECONSTRUCTING A SOURCE SIGNAL

CROSS-REFERENCE TO RELATED APPLICATIONS

This application is a continuation of U.S. patent application Ser. No. 14/087,080, filed on Nov. 22, 2013, which is a continuation of International Application No. PCT/CN2011/074508, filed on May 23, 2011. The afore-mentioned patent applications are hereby incorporated by reference in their entireties.

FIELD

The invention relates to the field of digital signal processing and in particular to multiple description coding (MDC).

BACKGROUND

For modern data communications, a plurality of network technologies enabling wireless networks or fixed line networks may be deployed. Such networks may in some cases not be reliable, such that data or information, respectively, is lost during transmission. In particular for multimedia content, a graceful quality degradation may be acceptable in the event of such information loss during transmission. To this end, MDC aims at achieving an acceptable quality degradation by generating a plurality of mutually refinable descriptions of a single signal source. These descriptions are transmitted from an encoder to a decoder, typically independently of each other. The descriptions have the property that generally any subset of the descriptions may make a reconstruction of the source signal possible. In particular, the more descriptions are available to the decoder, the better the reconstruction can be. As a consequence, MDC facilitates multiple quality levels depending on a state of a transmission channel of an unreliable communication network.

In conventional MDC decoders, the source signal may be reconstructed based on any possible subset of descriptions. The estimation of the source signal may be based on a minimization of a mean-squared error (MSE). However, the quality of reconstruction depends on a bitrate, at which the descriptions are transmitted, wherein a reconstruction quality increases with increasing bitrate. The usage of MSE may be perceptually motivated only at low distortions or equivalently at high bitrates. Hence, for lower bitrates, an obtained perceptual quality of the reconstructed signal using an MSE may be insufficient.

Furthermore, statistical properties of the signal source may be lost or altered after reconstruction with a mean-squared error-based scheme. This may further negatively affect the quality of the reconstructed signal.

SUMMARY

It is the object of the present invention to provide an improved concept for reconstructing a source signal that is encoded by multiple descriptions.

This object is achieved by the features of the independent claims. Further implementation forms are apparent from the dependent claims, the description and the drawings.

The invention is based on the finding that a source signal may be encoded with a set of descriptions, which are transmitted, for example over a communication network. The descriptions may be generated with an MDC encoder encoding a source signal which comprises a first probability density, which is fully or partially known or estimated at a decoder side. A subset of the set of descriptions can, at a decoder, be used to reconstruct a reconstructed signal comprising a second probability density. By manipulating the reconstructed signal, a manipulated reconstructed signal is obtained, which comprises a third probability density. Through statistically manipulating the reconstructed signal, the third probability density can be amended such that the third probability density is equal or similar to the first probability density of the source signal. The manipulation is chosen such that, irrespective of an operating bitrate during the reconstruction, a minimum similarity between the third probability density and the first probability density is maintained or achieved, respectively. Hence, the statistical properties of the manipulated reconstructed signal, in particular the similarity of the third probability density to the first probability density, may result in an improved quality of the manipulated reconstructed signal for all operating bitrates, and in particular also for low operating bitrates.

According to a first aspect, the invention relates to a method for reconstructing a source signal which is encoded by a set of at least two descriptions, the source signal having a first probability density, wherein the first probability density comprises a first statistical moment and a second statistical moment, the method comprising receiving a subset of the set of descriptions; reconstructing a reconstructed signal at an operating bitrate of a set of operating bitrates upon the basis of the subset of descriptions, the reconstructed signal having a second probability density, wherein the second probability density comprises a first statistical moment and a second statistical moment; and manipulating the reconstructed signal in order to obtain a manipulated reconstructed signal having a third probability density, wherein the third probability density comprises a first statistical moment and a second statistical moment, wherein the reconstructed signal is manipulated such that at least the first statistical moment and the second statistical moment of the third probability density are more similar to the first statistical moment and the second statistical moment of the source signal than the first statistical moment and the second statistical moment of the second probability density are, and wherein furthermore the reconstructed signal is manipulated such that, irrespective of the operating bitrate, a predetermined minimum similarity between the first statistical moment of the third probability density and the first statistical moment of the first probability density and between the second statistical moment of the third probability density and the second statistical moment of the first probability density is maintained.

The operating bitrate may be the total bitrate that is distributed among the descriptions, for example the bitrate available to a quantizer used in an encoding or decoding process. The bitrate may be distributed arbitrarily between the descriptions. According to some implementation forms of the first aspect, the allocation of the bitrate among the descriptions is symmetrical, such that all the descriptions are allocated with the same bitrate. However, each description may be associated with a different bitrate, so that the total available bitrate is distributed among the descriptions.

The term "quantizer" denotes a mapping from a signal value, e.g. a sample, to be quantized, which may be taken presumably from a continuous set, to a quantization index which is taken from a discrete set of indices. Correspondingly, the term "dequantizer" denotes a mapping from a quantization index taken from a discrete set of indices or from a subset of indices taken from the discrete set of indices to a reconstruction value.

The first statistical moment of the various probability densities is the mean value associated with the probability density. The second statistical moment of the various probability densities may be the variance associated with the probability density. The similarity between the statistical moments may be defined as an absolute difference between the respective statistical moments, for example between the means of the probability densities or between the variances of the probability densities. According to some implementation forms of the first aspect, the similarity may be defined as a normalized absolute difference, which may be the absolute difference of the statistical moments normalized with respect to the respective moment of the first probability density.

Regarding the predetermined minimum similarity, such value may be defined as a percentage value or a decibel (dB) value. According to some implementation forms, a deviation of 50% or 3 dB, respectively, may be acceptable and used as the predetermined minimum similarity. Furthermore, the predetermined minimum similarity may be different for the first statistical moment and the second statistical moment. In particular, a similarity for the first statistical moment may be regarded as having a higher importance than the similarity for the second statistical moment. Therefore, a smaller difference value may be desirable for the first statistical moment than for the second statistical moment. Accordingly, even a difference equal to zero can be set for the predetermined minimum similarity for the first statistical moment.

According to some implementation forms of the first aspect, the reconstructing of the source signal for all operating bitrates is improved when compared to a conventional MDC decoder that is based on a mean-squared error scheme. Thus, the described implementation forms render an optimal MSE performance subject to a constraint that the distribution of the reconstructed signal that is similar to the source distribution. This leads to improving a perceptual quality of the reconstruction. The improved quality is maintained also for lower operating bitrates, which is not possible in conventional MDC decoding methods that use solely the mean-squared error.

According to a first implementation form of the first aspect, the invention relates to a method for reconstructing a source signal, wherein the first statistical moment and the second statistical moment of the second probability density are manipulated to preserve the first statistical moment and the second statistical moment of the first probability density within a predetermined moment range. Accordingly, the manipulating is performed such that the first and the second statistical moment of the first probability density are at least partially preserved in the manipulated reconstructed signal within a given, predetermined range. According to some implementation forms, the manipulating is performed by means of an approximated transformation function, which can be implemented with less computational effort. However, according to some implementation forms, the moment range can be chosen such that the statistical moments of the first probability density are achieved within the third probability density of the manipulated reconstructed signal.

According to a second implementation form of the first aspect, the invention relates to a method for reconstructing a source signal, wherein the first statistical moments of the first probability density and the third probability density are equal, and wherein the second statistical moments of the first probability density and the third probability density are equal.

According to a third implementation form of the first aspect, the invention relates to a method for reconstructing a source signal, wherein the reconstructed signal is reconstructed using a reconstruction function that is dependent on a composition of descriptions in the subset of descriptions. Accordingly, if all descriptions of the set of descriptions are received, such that the subset of descriptions is equal to the (full) set of descriptions, reconstruction can be performed on the basis of the full set of descriptions. For example, the descriptions are indices or pointers, which unambiguously lead to a reconstruction value to be used in the reconstruction signal. However, if at least one of the descriptions of the set of descriptions is not received, a different reconstruction function will be used. In particular, the descriptions are mutually refinable.

According to a fourth implementation form of the first aspect, the invention relates to a method for reconstructing a source signal, wherein the source signal comprises an additive dither signal, in particular a pseudo-random dither signal, and wherein the reconstructing comprises subtracting the dither signal from the reconstructed signal. Such dither signals may have been added to the source signal during encoding and may facilitate the derivation of distribution preserving transformations. After reconstructing the reconstructed signal, the dither signal can then be subtracted in order to achieve the reconstructed signal. Adding and subtracting operations may be exchanged according to various implementation forms.

According to a fifth implementation form, the invention relates to a method for reconstructing a source signal, wherein the reconstructing comprises using an index assignment scheme, which is addressed by the descriptions of the set of descriptions, the index assignment scheme being used for deriving the set of descriptions encoding the source signal. For example, the index assignment scheme may be represented by means of an index assignment matrix that is two- or more-dimensional, wherein the index assignment matrix consists of non-empty entries containing unique, so-called central indices and empty entries. During encoding, indices pointing to such a unique value are determined and chosen to be the descriptions for the encoded value of the source signal. Accordingly, during reconstruction, the received descriptions may point to a value, if all descriptions are received, or a set of values, if one or more descriptions are lost, within the index assignment scheme or matrix, respectively. If one or more descriptions are lost, a reconstruction value associated with the set of values may be chosen, for example, a most probable value for the set of values.

According to a sixth implementation form of the first aspect, the invention relates to a method for reconstructing a source signal, wherein the manipulating the reconstructed signal comprises transforming the reconstructed signal according to a statistical transformation function, the transformation function being dependent on a composition of descriptions in the subset of descriptions. Hence, the transformation function is determined from the knowledge, which descriptions of the set of descriptions are received and which descriptions may be lost.

According to some implementation forms, the transformation function T(x) is defined according to the following formula:

$$T(x) = F_X^{-1}\left\{\frac{1}{\Delta}\int_{-\frac{\Delta}{2}}^{\frac{\Delta}{2}} F_X(x-\tau)d\tau\right\},$$

where $\Delta$ is a quantizer step size, $F_X(x)$ is the cumulative distribution function of variable X that is related to the probability density function $f_X(\cdot)$ of the first probability density, as $$F_X(x) = \int_{-\infty}^{x} f_X(\tau)d\tau,$$

and $F_X^{-1}(\cdot)$ denotes the inverse cumulative distribution function.

The probability density function may be known in the decoding process in advance. The above transformation function T(x) may be used if all, for example two, descriptions are received, and the first probability distribution should be preserved exactly or almost exactly.

According to some implementation forms, the statistical transformation function T(x) may be defined according to the following formula:

$$T(x) = \sqrt{\frac{\sigma_X^2}{\sigma_X^2 + \frac{\Delta^2}{12}}} \, x,$$

where $\Delta$ is a quantizer step size, and $$\sigma_X^2 = \int_{-\infty}^{\infty} x^2 f_X(x)\,dx$$

is the variance of variable X that is related to the probability density function $f_X(\cdot)$ of the first probability density.

This transformation function T(x) may be used if all, for example two, descriptions are received, and the first probability distribution should be preserved approximately within a third probability distribution. In particular, the first and the second statistical moment of the third probability distribution are preserved to be equal or approximately equal to the first and the second statistical moment of the first probability density.

According to some implementation forms, the transformation function T(x) may be defined according to the following formula:

$$T(x) = F_X^{-1}\left\{\frac{1}{2M\Delta} \sum_{i \in P(M)} \int_{\Delta_l(i)}^{\Delta_r(i)} F_X(x-\tau)\,d\tau\right\},$$

where $\Delta$ is a quantizer step size, M is an index assignment parameter, $F_X(x)$ is the cumulative distribution function of variable X that is related to the probability density function $f_X(\cdot)$ of the first probability density, as $$F_X(x) = \int_{-\infty}^{x} f_X(\tau)d\tau,$$

and $F_X^{-1}(\cdot)$ denotes the inverse cumulative distribution function, P(M) is a set of indices representing the index assignment pattern of the index assignment scheme being used for deriving the set of descriptions encoding the source signal, $$\Delta_l(i) = -(i - \overline{P})\Delta - \frac{\Delta}{2} \text{ and } \Delta_r(i) = -(i - \overline{P})\Delta + \frac{\Delta}{2}, \text{ with}$$

$$\overline{P} = \frac{1}{2M} \sum_{i \in P(M)} i.$$

If a description is received, the above transformation function T(x) can be used to transform the reconstructed signal such that the manipulated reconstructed signal has a third probability density being equal or approximately equal to the first probability density.

According to some implementation forms, the transformation function T(x) may be defined according to the following formula:

$$T(x) = \sqrt{\frac{\sigma_X^2}{\sigma_X^2 + \frac{\Delta^2 M^4}{3}}} \, x,$$

where $\Delta$ is a quantizer step size, M is an index assignment parameter and $$\sigma_X^2 = \int_{-\infty}^{\infty} x^2 f_X(x)\,dx$$

is the variance of variable X that is related to the probability density function $f_X(\cdot)$ of the first probability density.

If only some, for example one, description is received, and the first probability distribution should be approximated with less computational effort, the above transformation function T(x) may be used. In particular, the first and the second statistical moment of the first probability density may be preserved by this formula.

The usage of the above-described transformation functions may be combined, wherein respective usage depends on the composition of the subset of descriptions received and the desired grade of preserving or approximation of the first probability density for the third probability density of the manipulated reconstructed signal.

According to a second aspect, the invention relates to a decoder for reconstructing a source signal, which is encoded by a set of at least two descriptions, and the source signal having a first probability density, wherein the first probability density comprises a first statistical moment and a second statistical moment. The decoder comprises an input for receiving a subset of the set of descriptions, a reconstructor for reconstructing a reconstructed signal at an operating bitrate of a set of operating bitrates upon the basis of the subset of descriptions, the reconstructed signal having a second probability density, wherein the second probability density comprises a first statistical moment and a second statistical moment, and a transformer for manipulating the reconstructed signal in order to obtain a manipulated reconstructed signal having a third probability density, wherein the third probability density comprises a first statistical moment and a second statistical moment, wherein the transformer is configured to manipulate the reconstructed signal such that at least the first statistical moment and the second statistical moment of the third probability density are more similar to the first statistical moment and the second statistical moment of the source signal than the first statistical moment and the second statistical moment of the second probability density are, and wherein the transformer is furthermore configured to manipulate the reconstructed signal such that, irrespective of the operating bitrate, a predetermined minimum similarity between the first statistical moment of the third probability density and the first statistical moment of the first probability density and between the second statistical moment of the third probability density and the second statistical moment of the first probability density is maintained.

According to a first implementation form of the second aspect, the invention relates to a decoder, wherein the transformer is configured to manipulate the first statistical moment and the second statistical moment of the second probability density in order to preserve the first statistical moment and the second statistical moment of the first probability density within a predetermined moment range. Hence, the transformer can be arranged such that the predetermined moment range can be achieved.

According to a second implementation form of the second aspect, the invention relates to a decoder, wherein the reconstructor comprises a central reconstruction path, which is configured to reconstruct the reconstructed signal upon the basis of index information, in particular unique index information, the central reconstruction path comprising an indexer configured to determine the index information upon the basis of the set of descriptions.

The descriptions of the set of descriptions can for example be used to generate one or more index values, which form the index information. The index information may point to a unique value in an index assignment scheme as described above. In particular, the central reconstruction path may be active if all descriptions are received such that the subset of descriptions is equal to the set of descriptions.

According to a third implementation form of the second aspect, the invention relates to a decoder, wherein the reconstructor comprises at least one side reconstruction path, which is configured to reconstruct the reconstructed signal upon the basis of mapping information, the at least one side reconstruction path comprising a mapper configured to determine the mapping information upon the basis of the descriptions of the subset and of a composition of descriptions in the subset.

In particular, one side reconstruction path is activated or used for a given subset of description if one or more descriptions are lost such that no unique value may be determined directly. However, the remaining received descriptions are used to determine mapping information, which is the basis for reconstructing the reconstructed signal. The composition of the subset of descriptions may determine how to derive the reconstructed signal from the mapping information, for example.

According to a fourth implementation form of the second aspect, the invention relates to a decoder, wherein the transformer is configured to perform the manipulating upon the basis of a composition of descriptions in the subset of descriptions. Hence, different manipulations may be performed for receiving the full set of descriptions or a subset of descriptions. Various transformation functions may be used in the transformer, which depend on the composition of the subset and on the grade of distribution preservation. Various embodiments of the transformer become apparent with respect to the explanations for the sixth implementation form of the first aspect regarding the statistical transformation functions.

DETAILED DESCRIPTION OF THE EMBODIMENTS

Figure 1:
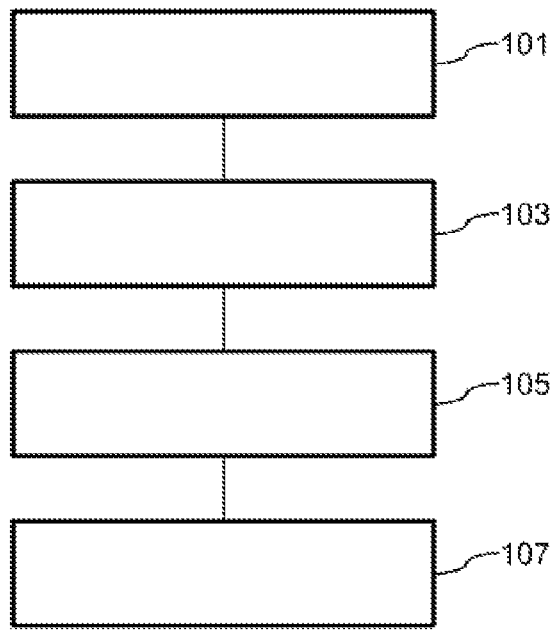
FIG. 1 shows a flowchart of a method according to an implementation form.

FIG. 1 shows a flowchart of a method for reconstructing a source signal according to an implementation form. As a prerequisite, in step 101, the source signal is encoded by a set of at least two descriptions, for example by an MDC encoder. The source signal has a first probability density, which comprises a first statistical moment and a second statistical moment. The set of descriptions is transmitted over a communication network, which may be unreliable, since all or some descriptions may be lost during the transmission resulting in a situation that only a subset of the descriptions is available to the decoder.

In step 103, a subset of the set of descriptions is received. The subset may be equal to the set of descriptions, such that all descriptions used for encoding the source signal are received. However, as the communication network may be unreliable, the subset may comprise a smaller number of descriptions than the full set of descriptions.

In step 105, a reconstructed signal is reconstructed at an operating bitrate of a set of operating bitrates upon the basis of the subsets of descriptions that have been received in step 103. The reconstructed signal has a second probability density, which comprises a first statistical moment and a second statistical moment. The quality of reconstruction may be dependent on the composition of descriptions in the received subset of descriptions. In general, it can be assumed that the more descriptions are received, the better the quality of the reconstructed signal is.

In step 107, the reconstructed signal is manipulated in order to maintain a manipulated reconstructed signal having a third probability density, which comprises a first statistical moment and a second statistical moment. The reconstructed signal is manipulated such that at least the first statistical moment and the second statistical moment of the third probability density are more similar to the first statistical moment and the second statistical moment of the source signal than the first statistical moment and the second statistical moment of the second probability density are. Furthermore, the reconstructed signal is manipulated such that, irrespective of the operating bitrate, a predetermined minimum similarity between the first statistical moment of the third probability density and the first statistical moment of the first probability density and between the second statistical moment of the third probability density and the second statistical moment of the first probability density is maintained.

The above method steps will be explained in more detail using an exemplary MDC encoding and decoding scheme, which in particular uses a two-description encoding/decoding.

It shall, however, be noted that, the source signal may be encoded by a set of more than two descriptions. In that case, for each description sub-set, a side dequantizer at the decoder is deployed. The decoder may further comprise a central quantizer.

The scheme is operating on a scalar random variable that is distributed according to some known probability density function (p.d.f.). In the general case, the quantized signal has a non-zero mean μ. The mean μ may be subtracted before coding without affecting generality of the scheme. After subtracting the mean, we obtain a zero-mean signal represented by a random variable X that is distributed according to some known p.d.f. $f_X$ may be known by the encoder and the decoder. In particular, information about $f_X$ may be transmitted to the decoder or the decoder may use an approximation to $f_X$.

The variable X will be quantized by multiple description quantization. According to some scenario, the samples of the signal represented by the random variable X are independent. In the considered example the coding is performed on per-sample basis.

The first operation comprises adding a sample of a pseudo-random dither Z to the input sample X, the result of this operation is then quantized by means of a uniform scalar quantizer with a step size Δ. The quantization yields a quantization index IC. The quantization may conveniently be implemented by means of rounding. Let [.] denote a rounding operation. Therefore, $$I_C=[(X+Z)/\Delta] \quad (1)$$

The encoder and the decoder may be configured in the same way, e.g. they both are operating with the same step size of the central quantizer Δ, and they use exactly the same index assignment configuration. In particular, this condition may be achieved when Δ and M are predefined or transmitted to the decoder.

The randomness of the dither signal Z may be shared between the encoder and the decoder, e.g. the dither signal Z is pseudo-random. In particular, the dither Z may be generated by a random number generation that facilitates generation of the random signal that is uniformly distributed within a predefined support region. In particular, the dither signal Z may be uniformly distributed within the interval (0, 2MΔ). If the pseudo-random dither is used, the synchronicity between the encoder and the decoder must be maintained. This may be achieved, for example, when the state of the random number generation is reset on a fixed time basis rendering synchronization between the encoder and the decoder.

The index IC is a so-called central index. The central index IC may be mapped to a pair of so-called side indices I0 and I1 by means of so-called index assignment algorithm, IA. The indices I0 and I1 may be further encoded by means of an entropy coder, e.g. arithmetic encoder, to generate a variable length binary code.

The indices I0 and I1 are transmitted independently through an unreliable network. At this point, we call them the descriptions. Independent transmission may be achieved by embedding a bit-stream associated with the first description into one packet and embedding the bit-stream associated with the second description into another packet. Some or all of the descriptions may be lost during the transmission. The operation of the decoder depends on the number and/or the composition of the received descriptions. The general notion is that all the received descriptions are used to perform signal reconstruction. The more descriptions are received the better the quality of the reconstruction. The possible cases of description losses are as follows.

CASE 1: It is assumed that both descriptions I0 and I1 are received.

In this case, since the decoder knows the index assignment (IA), it is able to determine uniquely the quantization index of the central quantizer IC that corresponds to that particular pair of I0 and I1. Since the central quantizer index IC is known, a decoder of the central quantizer $Q^{-1}$ may be used to perform the reconstruction. This operation is implemented according to the following formula:

$$X_C=I_C \cdot \Delta. \quad (2)$$

In the next step, the pseudo-random dither Z is subtracted from $X_C$, according to $$\tilde{X}_C = X_C - Z. \quad (3)$$

It is assumed that the decoder has access to Z, which is possible, as Z is pseudo-random.

The statistical distribution p.d.f. of $\tilde{X}_C$ may be known precisely or at least approximately precise. For example, according to some implementation forms, $\tilde{X}_C$ may be distributed as $$f_X * U\left(-\frac{\Delta}{2}, \frac{\Delta}{2}\right),$$

where * denotes a convolution operator. Therefore, it is possible to derive an analytical transformation that operates on $\tilde{X}_C$ and transforms $\tilde{X}_C$ into a new variable $\hat{X}_C$ that is distributed precisely according to the same p.d.f. as X. The transformation may be of the form:

$$T(x) = F_X^{-1}\left\{\frac{1}{\Delta}\int_{-\frac{\Delta}{2}}^{\frac{\Delta}{2}} F_X(x-\tau)d\tau\right\}, \quad (4)$$

where $F_X(x)$ is the cumulative distribution function (c.d.f.) of variable X that is related to the p.d.f. $f_X(\cdot)$, as $$F_X(x) = \int_{-\infty}^{x} f_X(\tau)d\tau, \quad (5)$$

and $F_X^{-1}(\cdot)$ denotes the inverse c.d.f. It is assumed that $F_X^{-1}(\alpha)=\inf_\beta\{F_X(\beta)\geq\alpha\}$. Therefore, the new variable $\hat{X}_C$ is computed according to $$\hat{X}_C = T(\tilde{X}_C). \quad (6)$$

The last decoding stage may comprise adding back the mean value vt yielding a final reconstruction.

In some implementations, it may be of practical interest to relax the distribution preserving constraint to a setting where the distribution is preserved approximately. This could be seen as a low complexity alternative of the main algorithm. In the case of preserving the distribution approximately, the transformation may be of the form:

$$T(x) = \sqrt{\frac{\sigma_X^2}{\sigma_X^2 + \frac{\Delta^2}{12}}}\, x, \quad (7)$$

where $$\sigma_X^2 = \int_{-\infty}^{\infty} x^2 f_X(x) dx$$ (5)

is the variance of X.

CASE 2: It is assumed that one description is received.

If one description is received, the side dequantizer associated with the description that was successfully received is used. Suppose that one description was lost and only the index Ij is available to one decoder (j=0 or 1). The index Ij is uniquely associated, e.g. by means of one-to-one mapping, with some reconstruction point of the j-th side quantizer that we denote by $\tilde{X}'_j$. The reconstruction points of the side quantizers may be pre-computed and the mapping form Ij to $\tilde{X}'_j$ may be implemented by means of a look-up table. An explanation what the reconstruction points are and how they are related to the index assignment will be described later in conjunction with FIG. 4 and FIG. 5A.

The intermediate reconstruction is obtained by selecting a reconstruction point $\tilde{X}'_j$ of the j-th side dequantizer that is associated with the received index Ij and subtracting the realization of the pseudorandom dither Z, i.e.

$$\tilde{X}_j = \tilde{X}'_j - Z.$$ (8)

One property of the proposed approach is that the statistical distribution of $\tilde{X}_j$ is essentially known in an analytical form. For example, $\tilde{X}_j$ may be distributed as $f_X * f_N$ where * denotes a convolution operator and $f_N$ is the probability density function of the quantization noise of the j-th side quantizer. The probability density function of the quantization noise $f_N$, according to some implementation forms, may be uniform within a side quantization cell specified by P(M) and Δ that it is reflected around its origin $\bar{P} \cdot \Delta$, i.e., $$f_N = \frac{1}{2M\Delta} \sum_{i \in P(M)} U(\Delta_l(i), \Delta_r(i)),$$

where $\Delta_l(i)$, $\Delta_r(i)$ and $\bar{P}$ are to be defined with the following equation (9).

The form of the statistical distribution is analytical and thus it facilitates derivation of an analytical distribution preserving transformation. In this case the distribution preserving transformation may be computed as:

$$T_j(x) = F_X^{-1}\left\{ \frac{1}{2M\Delta} \sum_{i \in P(M)} \int_{\Delta_l(i)}^{\Delta_r(i)} F_X(x-\tau) d\tau \right\},$$ (9)

where the integration boundaries and $\Delta_l(i)$ and $\Delta_r(i)$ may be computed as follows. In order to compute $\Delta_l(i)$ and $\Delta_r(i)$, $\bar{P}$ needs to be defined, namely the mean of an index pattern specified by some set P(M). $F_X(x)$ is the c.d.f. of variable X that is related to the p.d.f. and $F_X^{-1}(\cdot)$ denotes the inverse c.d.f.

An exemplary index assignment scheme may have a property that it generates always the same pattern of the central cells within each side cell. This property facilitates dithering and obtaining an analytical additive noise model of side quantizer that is accurate at any bitrate and any configuration of the index assignment, specified by the parameter M. It is assumed, for example, that the pattern of central indices within any side quantization cell is specified by the following set:

$$P(M)=\{0\}\cup\{i(M-1)\}_{i=1}^{M-1}\cup\{(M-1)^2+M\}\cup\{(M-1)^2+M+i(M+1)\}_{i=1}^{M-1}.$$ (10)

It can be seen that the set P(M) contains precisely 2M elements, therefore every side quantization cell contains precisely 2M central cells. The expression (10) may be used for any M, however, lower values of M may be of more practical relevance. The parameter M facilitates a trade-off between the distortion of the central quantizer and the distortion of the side quantizer.

It is assumed, for example, that the decoder knows the configuration of the index assignment that was used during the encoding, specified by M, therefore, it is able to compute P(M). For instance, let M=2. The corresponding pattern of indices is P(2)={0,1,3,6}.

$\bar{P}$ may be computed as $$\bar{P} = \frac{1}{2M} \sum_{i \in P(M)} i.$$ (11)

The integration boundaries $\Delta_l(i)$ may then be computed as $$\Delta_l(i) = -(i - \bar{P})\Delta - \frac{\Delta}{2},$$ (12)

and $$\Delta_r(i) = -(i - \bar{P})\Delta + \frac{\Delta}{2}.$$ (13)

Note that the integration boundaries may be pre-computed for any given M and Δ leading to an efficient implementation. The transformation $T_j$ is applied to $\tilde{X}_j$ yielding new variable $\hat{X}_j = T_j(\tilde{X}_j)$ that is distributed according to the p.d.f. of the input signal X. As a final decoding step, the mean value μ may be added back to the reconstructed signal yielding a final reconstruction.

In some cases, it may be desired to use a low complexity alternative of the distribution preserving transformation. Instead of preserving the original source p.d.f. exactly, it is possible to preserve it approximately by preserving only the first and the second statistical moment of $f_X$, the mean and the variance, respectively. The periodic pattern of central quantization indices within the side quantization cell facilitates derivation of a moment preserving transformation. The transformation is of form $$T_{j-LC}(x) = \sqrt{\frac{\sigma_X^2}{\sigma_X^2 + \sigma_j^2}} \, x,$$ (14)

where $\sigma_j^2$ is the quantization noise error variance for the side j-th quantizer, which is a function of Δ and M. The value of $\sigma_j^2$ may be computed from the following formula:

$$\sigma_j^2 = \frac{\Delta^2 M^4}{3}.$$ (15)

CASE 3: It is assumed that no description is received.

If no description is received, the decoder still performs signal reconstruction. In this case the reconstruction is obtained by means of signal synthesis utilizing the available information about the signal p.d.f. $f_X$ or its approximation. There are several state-of-the-art methods that may be used to perform synthesis. In particular, the inverse sampling method leads to a neat construction of the decoder for the case if all the descriptions are lost. Assuming that the synchronization between the encoder and decoder is maintained, the decoder has access to the dither signal $Z \sim U\{0, 2M\Delta\}$. In this case, a reconstruction $\hat{X}_Z$ may be received by applying the following transformation directly to the dither signal:

$$T_Z(z) = F_X^{-1}\left(\frac{z}{2M\Delta}\right), \quad (16)$$

where $F_X^{-1}(\cdot)$ denotes the inverse c.d.f. It is assumed that $F_X^{-1}(\alpha) = \inf_\beta \{F_X(\beta) \geq \alpha\}$. The reconstruction $\hat{X}_Z$ is then obtained by taking $\hat{X}_Z = T_Z(Z)$. As a final decoding step, the mean value $\mu$ may be added to $\hat{X}_Z$ yielding a final reconstruction.

In some cases, it might be of practical interest to consider a low complexity alternative to the usage of $T_Z(\cdot)$. If the distribution preserving constraint is relaxed and the distribution is preserved approximately, the reconstruction may be obtained by using the following transformation that preserves the second moment of the original density $f_X$:

$$T_{Z-LC}(z) = \sqrt{\frac{12\sigma_x^2}{\Delta^2}} \cdot (z - M\Delta). \quad (17)$$

Regarding the operating bitrate during reconstruction, it may be referred to as the total bitrate that is distributed among the descriptions, e.g. the bitrate available to the quantizer. In general, the bitrate may be distributed arbitrarily between the descriptions. According to some embodiments, the allocation of bitrate among the descriptions is symmetrical, meaning that all the descriptions are allocated with the same bitrate.

The bitrate may depend on the particular selection of $\Delta$, M and the first probability density function $f_X$.

The total bitrate may be subject to frequent changes because $f_X$ may change in time. In addition, some properties of the communication channel may vary during the transmission, e.g. due to packet loss rate and/or available transmission bitrate. These changes affect values of $\Delta$ and M influencing the operating bitrate.

Regarding similarity between the third and the first probability density, in various implementations it is aimed at preserving the first p.d.f., meaning that the reconstructed signal may be distributed according to the first p.d.f. This approach can be motivated on theoretical grounds and also it is experimentally proven to be perceptually efficient. However, the benefit could also be obtained if the first p.d.f. is preserved approximately by allowing a small deviation from the first p.d.f. There are several similarity measures that may be considered.

The simplest measure may be an absolute difference between the statistical moments. Let us consider two probability distribution functions $f_X$ and $f_Y$. Both p.d.f.s comprise their first and second statistical moments. The first statistical moment is the mean. In this case we have:

$$\mu_X = \int_{-\infty}^{\infty} x f_X(x) dx \quad (18)$$

and $$\mu_Y = \int_{-\infty}^{\infty} x f_Y(x) dx. \quad (19)$$

The second statistical moment is the variance. We define $$\sigma_X^2 = \int_{-\infty}^{\infty} (x - \mu_X)^2 f_X(x) dx \quad (20)$$

and $$\sigma_Y^2 = \int_{-\infty}^{\infty} (x - \mu_Y)^2 f_Y(x) dx. \quad (21)$$

The absolute difference similarity measure may be defined for the first moment as $$\eta_\mu = |\mu_X - \mu_Y|, \quad (22)$$

and for the second moment as $$\eta_\sigma^2 = |\sigma_X^2 - \sigma_Y^2|. \quad (23)$$

According to some implementations, it may be more convenient to define a normalized absolute difference similarity measure. In this case, the similarity between the first moment may be defined as $$\gamma_\mu = \frac{|\mu_X - \mu_Y|}{|\mu_X|}, \quad (24)$$

and for the second moment $$\gamma_{\sigma^2} = \frac{|\sigma_X^2 - \sigma_Y^2|}{\sigma_X^2}. \quad (25)$$

If the normalized absolute difference similarity measure is used, an interval may be formulated where the range of similarity is defined. For example, the following thresholds may be set up:

$$\gamma_{\sigma^2} \leq \frac{1}{2}, \gamma_\mu \leq \frac{1}{2}. \quad (26)$$

In general, any deviations from the original moments may not be allowed, but it may be chosen that a 3 dB difference is acceptable, which would lead to 50% energy loss/increase of the signal. For example, assuming that at most a 3 dB difference is acceptable, for the second moment, the following test formula may be used:

$$\Gamma_{\sigma^2} = \begin{cases} 10\log_{10}\beta, & \beta \geq 1 \\ 10\log_{10}\left(\beta^{-1} + \frac{1}{2}\right), & \beta < 1 \end{cases}, \text{ with } \beta = \frac{\sigma_X^2}{\sigma_Y^2}, \quad (27)$$

it may be defined that $\Gamma_{\sigma^2} \leq 3$. Thus, the above equation provides a test whether the 3 dB condition is fulfilled or not.

According to some implementation forms, the predetermined minimum similarity may be the same for the first and the second statistical moments. However, a predetermined minimum similarity may be chosen such that less difference is allowed for the first statistical moments than for the second statistical moments. In particular, none or only a negligible difference may be allowed for the first statistical moments, while a certain difference, e.g. 3 dB, may be allowed for the second statistical moments.

For example, assuming that at most a 3 dB difference is acceptable, for the first moment, the following test formula may be used:

$$\Gamma_\mu = \begin{cases} 10\log_{10}\beta, & \beta \geq 1 \\ 10\log_{10}\left(\beta^{-1} + \frac{1}{2}\right), & \beta < 1 \end{cases}, \text{ with } \beta = \left|\frac{\mu_X}{\mu_Y}\right|. \quad (28)$$

The allowed deviation may be therefore expressed by the following constraint $\Gamma_\mu \leq 3$ in particular it may be desirable to have $\Gamma_\mu = 0$.

Since the probability density functions considered here always comprise the first and the second statistical moment, the proposed similarity measure will work also in the case when the distributions are preserved exactly, i.e. full complexity case. Alternatively, in the case of preserving of a p.d.f. exactly, one may use the Kullback-Leibler divergence.

The Kullback-Leibler divergence between $f_X$ and $f_Y$ is defined as $$D_{KL}(f_X \| f_Y) = \int_{-\infty}^{\infty} f_X(x) \log_2 \frac{f_X(x)}{f_Y(x)} dx, \quad (29)$$

which is measured in bits. This measure is particularly useful to evaluate the case where the third distribution is intended to be essentially exactly the same as the first distribution.

Figure 2:
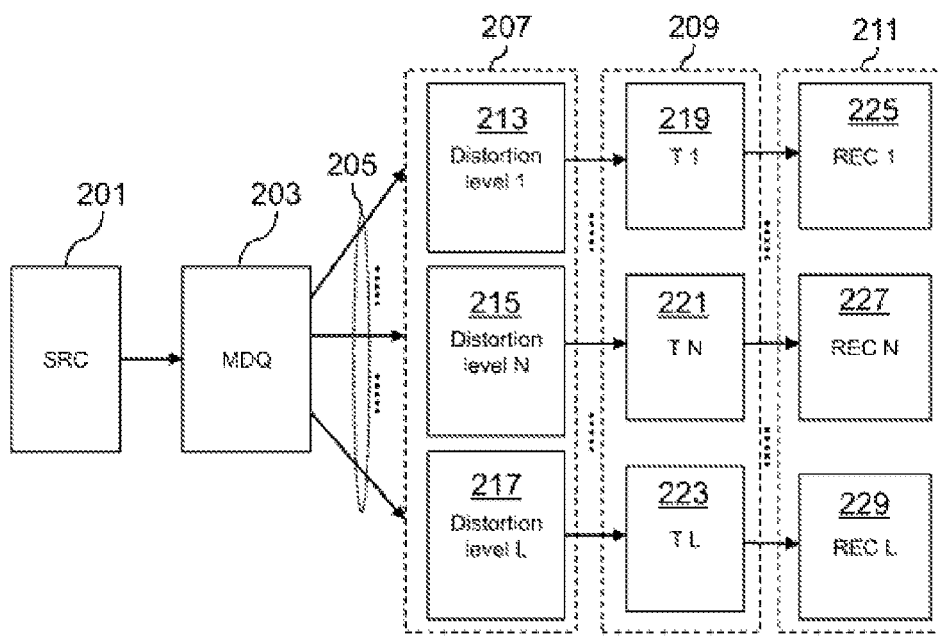
FIG. 2 shows a block diagram of an MDC system according to an implementation form.

FIG. 2 shows a block diagram of an MDC system according to an implementation form. Although the main focus of the description is directed to the decoding part of the MDC system, an encoding part is described as well for comprehensive understanding.

In block 201, a source signal is provided, wherein a statistical signal model of the source signal to be quantized is known. For example, such a statistical signal model may be represented or be equivalent to the p.d.f., which may be called the first p.d.f. The source signal is provided at block 203 that, for example, incorporates a multiple description quantizer (MDQ). The quantizer may use dithering and a periodic index assignment, as described above, in order to generate a set 205 of indices or descriptions encoding the source signal. The set 205 of descriptions is transmitted to a decoder side, which includes a reconstructor 207, a transformer 209 and an output buffer 211. During transmission, none, some or all descriptions may be lost, such that a subset of descriptions is received at the decoder side. The subset of descriptions accordingly may be equal to the set of descriptions or be a received subset of descriptions or be an empty set.

Depending on the composition of the subset of descriptions received, various distortion levels 1, . . . , N, . . . , L may be present at the reconstructor 207. For example, in a distortion level 1, all the descriptions are received. In a distortion level N, for example, N out of M descriptions are received, and in the distortion level L, all the descriptions are lost. The reconstructor 207 comprises several reconstructor blocks 213, 215, 217, which are respectively adapted to reconstruct a reconstructed signal based on the specific distortion level defined by the composition of the subset of descriptions received.

Due to the reconstruction, a respective reconstructed signal is provided to the transformer 209, the respective reconstructed signal having a second p.d.f. that is more or less similar to the first p.d.f., the similarity depending on the composition of the subset. However, the statistical properties of the reconstructed signal may be known in advance depending on the respective distortion level. Accordingly, in processing blocks 219, 221, 223 of the transformer 209, the reconstructed signal having the second p.d.f. can be statistically manipulated by means of a transformation function, which achieves a third p.d.f. for the manipulated reconstructed signal, which may be a re-establishment of the first p.d.f. Regarding various implementation forms of the transformation functions, it is referred to equations (4) to (17). The respective output of the transformer 209 is provided to the buffer 211, which comprises blocks 225, 227, 229 for the respective statistically manipulated reconstructed signal of the corresponding distortion level, each having a probability density equal or approximately equal to the first p.d.f., as described above.

Figure 3:
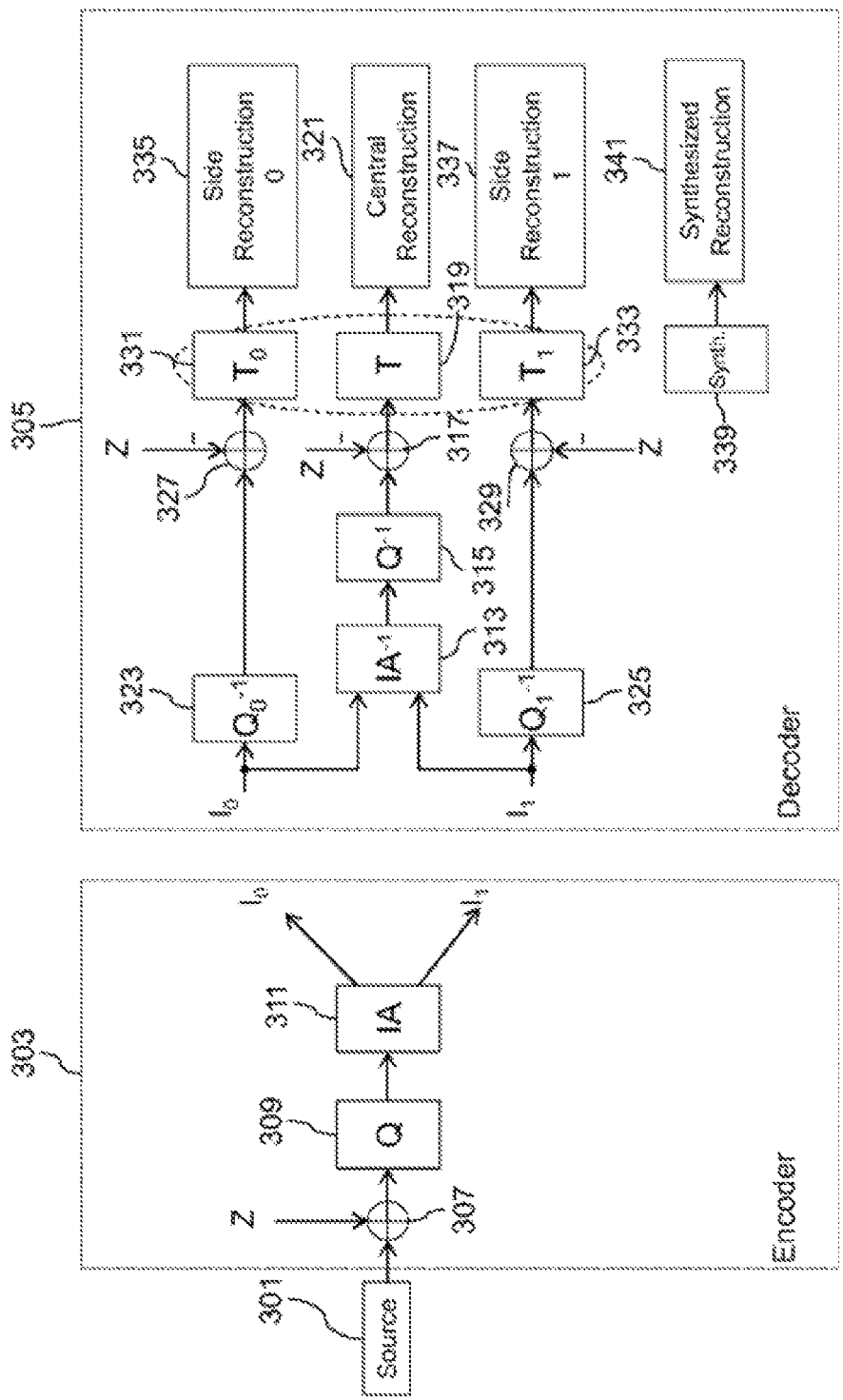
FIG. 3 shows a block diagram of an MDC system according to an implementation form.

FIG. 3 shows a further implementation form of an MDC system, wherein an input source signal 301 is encoded in an encoder 303 and decoded in a decoder 305. In the encoder 303, which is explained briefly for a comprehensive understanding of the decoder 305, the dither Z is added to the source signal 301 with an adder 307. The output of the adder 307 is provided to the quantizer 309 and further to an index assignment block 311, which generates two descriptions I0, I1, which may then be transmitted to the decoder 305. The function of the encoder 303 may be expressed by equation (1).

The decoder 305 may receive both descriptions I0, I1, one of the descriptions I0 or I1 or none of the descriptions. If both descriptions I0, I1 are received, they are provided to a reverse index assignment block 313, which performs a mapping of the received indices onto a value or a set of values, which is provided to a dequantizer 315. The operation of the dequantizer 315 may be implemented by equation (2). The result of the dequantizer 315 is provided to an adder 317, wherein the dither Z is subtracted, e.g. according to equation (3). The resulting value is provided to a central transformer 319, which may operate according to equations (4) or (7). Hence, in block 321 a manipulated reconstructed signal is available having a p.d.f. being the same as or similar to the first p.d.f. of the signal source. Blocks 313, 315, 317, 319, 321 form a central reconstruction path.

If only one of the descriptions I0, I1 is received, it is provided to a respective dequantizer and reconstructor 323 or 325, respectively. In these blocks 323, 325, a reconstruction point is determined from the received description, which will be explained in more detail with respect to FIG. 4 and FIG. 5A. Similar to adder 317, the dither signal Z is subtracted from the reconstruction points at adders 327 or 329, respectively, for example according to equation (8). The resulting signal is provided to transformation blocks 331 or 333, respectively, which perform a statistical manipulation or transformation of the signals, e.g. according to equations (9) or (14).

The resulting manipulated reconstructed signal is then provided to blocks 335 or 337, respectively, such that the reconstructed output signals have a third p.d.f. being equal or approximately equal to the first p.d.f. of the source signal.

Blocks 323, 327, 331 and 335 form a first side reconstruction path, and blocks 325, 329, 333, 337 form a second side reconstruction path.

As shown in FIG. 3, the side quantizer 0 comprises blocks 309, 311 and the output I0. The side quantizer 1 comprises blocks 309, 311 and the output I1.

A similarity between the probability densities of the signals in blocks 321, 335, 337 and the first probability density of the source signal may be defined in advance according to equations (18) to (29).

If all descriptions are lost, i.e. no description is received, a reconstructed signal may be synthesized in a synthesizer block 339, which, for example, operates according to equation (16) or (17). In particular, synthesis may be based on the dither signal Z. In the case of synthesis, a synthesized reconstruction signal may be provided in block 341, the reconstructed signal having a probability density being equal to or approximately equal to the first p.d.f. of the source signal.

Figure 4:
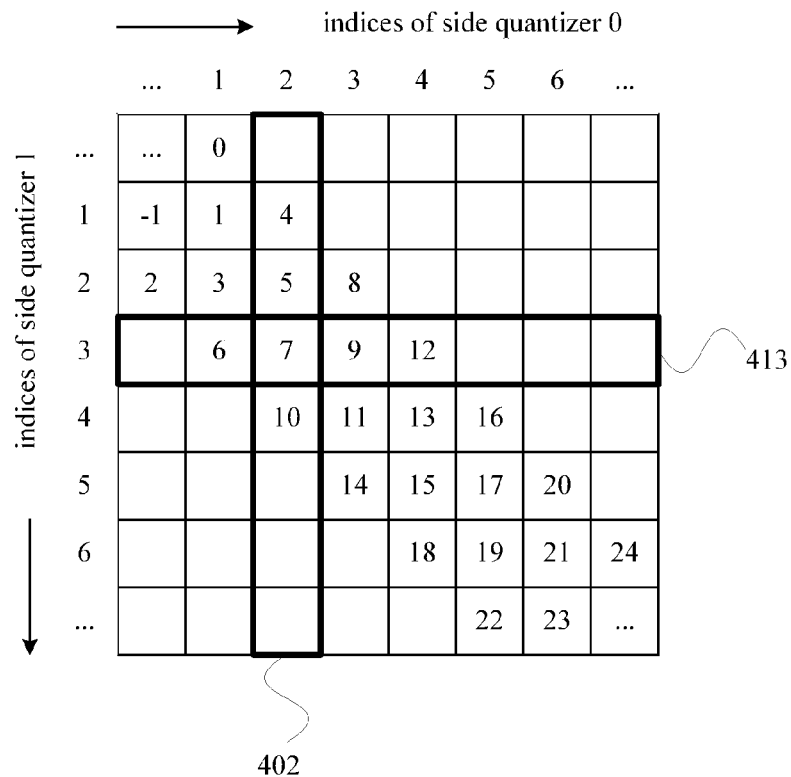
FIG. 4 shows an index assignment scheme according to an implementation form.

For the purposes of better illustrating the operation of the decoder 305, a particular configuration of the index assignment algorithm may be chosen. According to the above embodiment, the parameter M is chosen to M=2, therefore the index assignment matrix may have four diagonals. An exemplary index assignment scheme or index assignment matrix is shown in FIG. 4. Note that the index assignment generates the same pattern of a central cell within each side cell. The pattern is described by a set P(M), which in this case is P(2)={0, 1, 3, 6}. The pattern may be obtained by selecting a particular side quantization cell and subtracting the smallest central cell index within that side cell from all central indices belonging to that cell. For example, if side cell 2 of a side quantizer 0 (402) is considered, the central cells belonging to that side cell are {4, 5, 7, 10}, and the pattern P(2) may be computed as P(2)={4-4, 5-4, 7-4, 10-4}={0, 1, 3, 6}. For example, if side cell 3 of side quantizer 1 (413) is considered, the central cell belonging to that side cell are specified by a set {6,7,9,12}. The corresponding pattern is therefore P(2)={6-6, 7-6, 9-6, 12-6}={0, 1, 3, 6}.

The columns of the index assignment matrix shown in FIG. 4 are indexed by indices of the side quantizer 0 and the rows are indexed by indices of the side quantizer 1. The indexing of the side quantization case may be done in an arbitrary manner. However, each side quantization cell of each side quantizer may be indexed by a unique index. In the example shown in FIG. 4, it is assumed that the central index 7 was transmitted. The index is mapped to a pair of indices. In this case, index 2 of the side quantizer 0 is defined by column 402, and index 3 of the side quantizer 1, defined by row 413. It is referred to the indices in such a pair as side indices. If both side indices are available, the index assignment may be inverted and a corresponding central index may be determined uniquely from the index assignment matrix. As described, some side indices may be lost during the transmission. In this case, only these side indices that are available to the decoder are used for the reconstruction.

For the purposes of the illustration, we assume that the side index of the side quantization 0 has been lost. This implies that only the side index of the side quantizer 1 is available to the decoder. In this case, it is the index 3. It is known that the side index 3 is associated with a particular side quantization cell of row 413 that is a disjoint union of central cells. The side quantization cell consists of the following central cells {6, 7, 9, 12}. In this case, the pattern P(M) describing the corresponding configuration of the index assignment is {0, 1, 3, 6}. The pattern may be obtained by subtracting the smallest central index belonging to the side quantization cell from all the indices of the central cells belonging to the side cell. For example, P(M)={6-6, 7-6, 9-6, 12-6}={0, 1, 3, 6}.

Figure 5A:
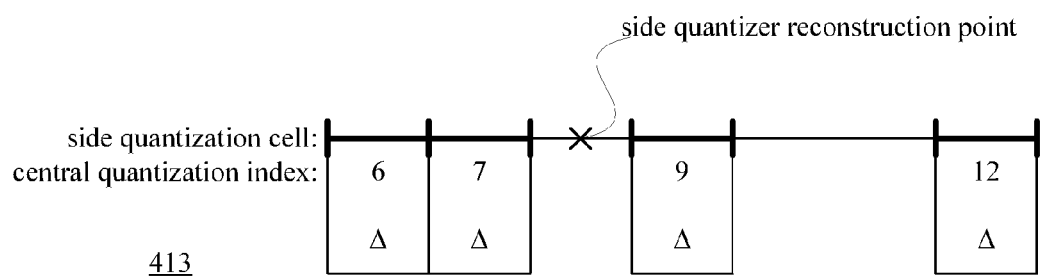
FIG. 5A shows an example of the side reconstruction for the case when one description is lost according to an implementation form.

This side quantization cell 413 is shown in FIG. 5A. The side quantization cell 413 consists of four central cells, each of which has a width equal to the quantizer step size $\Delta$. Each side quantization cell is associated with a single reconstruction point. The reconstruction point for the side quantization cell is computed by averaging the central indices belonging to this specific side quantization cell and by scaling the result with respect to the central quantizer step size $\Delta$. In this specific case, the mean value of the pattern is equal to 8.5=(6+7+9+12)/4. The exact position of the reconstruction point is therefore $8.5 \cdot \Delta$. It may be shown that such a method to compute the position of the reconstruction point is optimal with respect to MSE for the considered quantizer. The position of the reconstruction point facilitates a reconstruction that is as close as possible, in particular in terms of MSE, to the signal sample to be quantized.

With reference to FIG. 5A, the side dequantizer performs a mapping between a side index or set of indices to a single reconstruction value. FIG. 5A depicts the case where the side quantization index 3 of a side quantizer 1, as depicted in FIG. 4, is received. The index indicates the particular side quantization cell (413) that is associated with a single reconstruction value. The dequantizer mapping assigns the reconstruction value to the index or set of indices of the side quantizer.

Figure 5B:
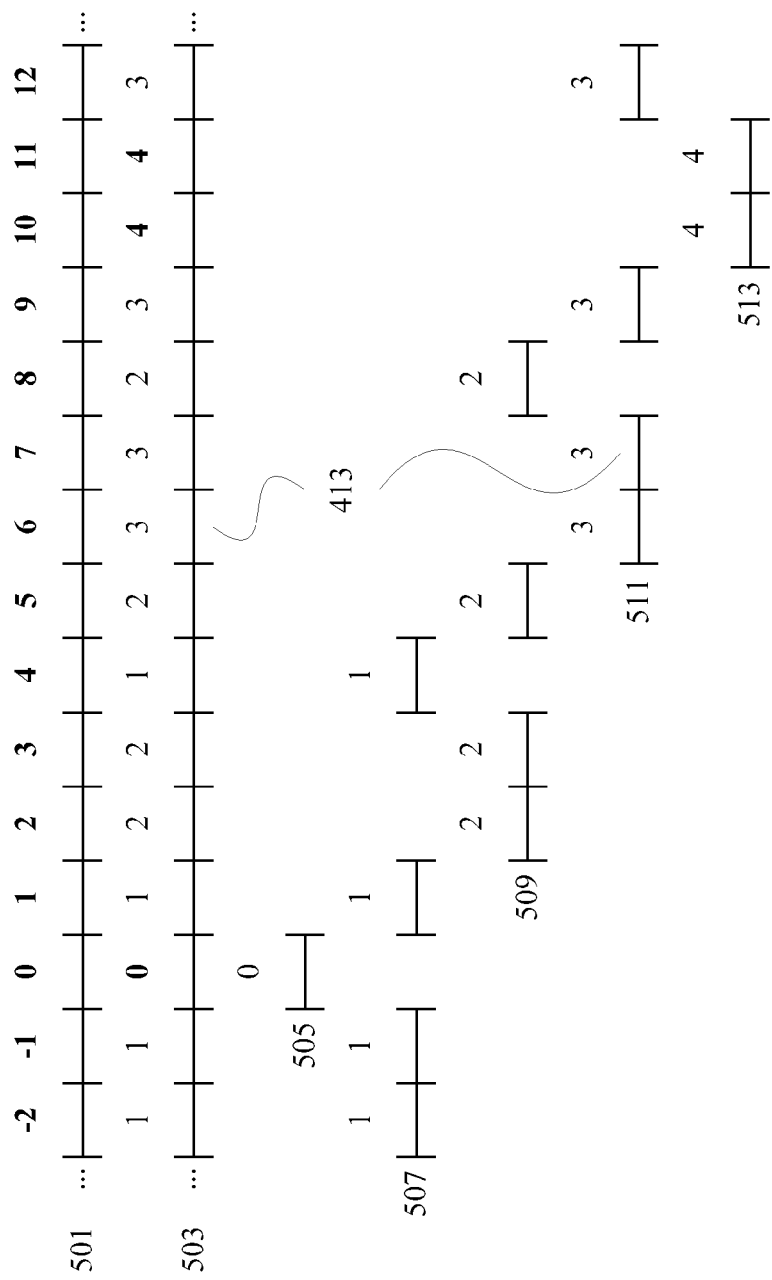
FIG. 5B shows a partition of side quantization cells into central quantization cells.

FIG. 5B shows a partition of side quantization cells into central quantization cells, with central quantization indices 501, side quantization cell indices 503 of the first quantizer side, which is only partly shown, cell 0 of the side quantizer 1, 505, side cell 1 of the side quantizer 1, 507, side cell 2 of the side quantizer 1, 509, side cell 3 of the side quantizer 1, 511, and side cell 4 of the side quantizer 1, 513, which is only partly shown.

With reference to FIGS. 3 to 5B, the side quantizer uses the partition of the central quantizer. The use of the partition of the central quantizer is described by the index assignment algorithm. All quantization cells of the central quantizer are indexed by the central indices that are the non-empty elements, i.e. elements having entries, of the index assignment matrix shown in FIG. 4. All central quantization cells are also indexed by side quantization indices of each side quantizer that is used.

The quantization cells {6, 7, 9, 12} of the side quantizer 1, denoted by reference sign 413 in FIG. 4 can for example be associated with side index 3 of the side quantizer 1. This means that they belong to a single quantization cell of the side quantizer 1. This cell is shown in FIG. 5A.

The central cells associated with indices {6, 7, 9, 12} shown in FIG. 4 belong for example to different cells of the side quantizer 0. For example, the central cell 6 belongs to the side quantization cell 1 of the side quantizer 0, the central cell 7 belongs to the side quantization cell 2 of the side quantizer 0, and so forth.

The sample that was quantized in order to be assigned to this specific quantization cell must have had a value within one of the intervals $$\left[6\Delta - \frac{\Delta}{2}, 6\Delta + \frac{\Delta}{2}\right], \left[7\Delta - \frac{\Delta}{2}, 7\Delta + \frac{\Delta}{2}\right], \left[9\Delta - \frac{\Delta}{2}, 9\Delta + \frac{\Delta}{2}\right] \text{ and}$$

$$\left[12\Delta - \frac{\Delta}{2}, 12\Delta + \frac{\Delta}{2}\right].$$

If the other description is not available, the decoder has no means to uniquely determine the true interval. It can, however, use a reconstruction point that leads to the minimum possible performance loss based on the mentioned intervals. Since there are more central cells at the left side of the considered side quantization cell, it is more likely that the true value of the signal to be quantized is located there. For example, it is the case where the reconstruction point is located in the position equal to the mean of the pattern of indices in the respective side quantization cell. It turns out that the best position of the reconstruction point in this case may be 8.5·Δ.

The exact positions of the reconstruction points may be found similarly for the other quantization cells and the other side quantizer. The mapping from the side quantizer index to the side quantizer reconstruction point can be pre-computed during the design of the multiple description quantizer. It may be conveniently implemented using a look-up table or, in the case of the specific index assignment that is used in this example, by rounding.

It may be noticed from the above example that usage of a large number of diagonals in the index assignment matrix leads to the situation where the side quantization cells are wide and thus the reconstruction with the side quantizers is coarse. By adjusting the number of diagonals in the index assignment matrix it is possible to perform a trade-off between the central and the side distortion. Usually this is done to optimize the MSE performance of the quantizer with respect to the description loss probability.

According to the above-described implementation forms of the decoding method and the decoder, a preservation or an approximate preservation of the signal distribution leads to improving a perceptual performance e.g. of multimedia communications employing MDC. The distribution preserving multiple description quantization described above may be particularly efficient in low bitrate coding scenarios, which may be of high practical relevance. In particular for those low bitrates, the described implementation forms provide a better performance than conventional MSE-based decoders. Furthermore, a continuous transition between parametric descriptions and rate distortion optimal descriptions in a function of the available bitrate may be possible. A flexibility of coding may be maintained such that, in particular, the encoder for multiple description coding may be redesigned and optimized based on an analytic criterion without the need of iterative or training procedures on the encoder and the decoder sides.

The above-described coding and decoding schemes may, for example, be used for quantization in multimedia communication systems over unreliable networks, and in particular for applications in speech, audio, image or video transmission, respectively. Furthermore, the described implementation forms can be used to extend a bandwidth if applied to multiple description coding of speech signals or audio signals. Due to the adaptability of the decoding scheme, a flexible multiple description quantization of a speech signal may be achieved, where the encoder may have a vocoder-like behavior at low operating bitrates and perform a rate distortion optimal coding for higher operation bitrates.

The proposed multiple description distribution preserving quantization (MD-DPQ) provides means for packet-loss concealment (PLC) in multimedia communications over communication networks with packet losses. In particular, it is useful in the situation when the coding is constrained by a delay constraint that prevents form using approaches involving forward error correction (FEC). In addition to that, the proposed MD-DPQ is particularly applicable in the situations where the exact packet loss probability remains unknown, which prevents from designing an efficient FEC coding strategy. The MD-DPQ is still operational also in the situation when the packet-loss rate is different than the packet-loss rate assumed in the design.

The main advantage of the proposed MD-DPQ over the state-of-the-art multiple description quantization is related to the fact that it uses mean squared error criterion combined with a distribution preserving constraint that is perceptually more efficient than relying exclusively on the mean squared error in the case of the state-of-the-art systems. Another advantage of the proposed method is that it can be optimized on the fly as it does not employ any iterative procedures. Due to this property, it may be used in a context of rate-distortion flexible coding where it is important to be able to redesign the quantizers to match any bitrate constraint. The flexible coding is useful, for instance, if the properties of communication channels are variable, e.g. available bandwidth, bit-rate, packet-loss rate.

Figure 6:
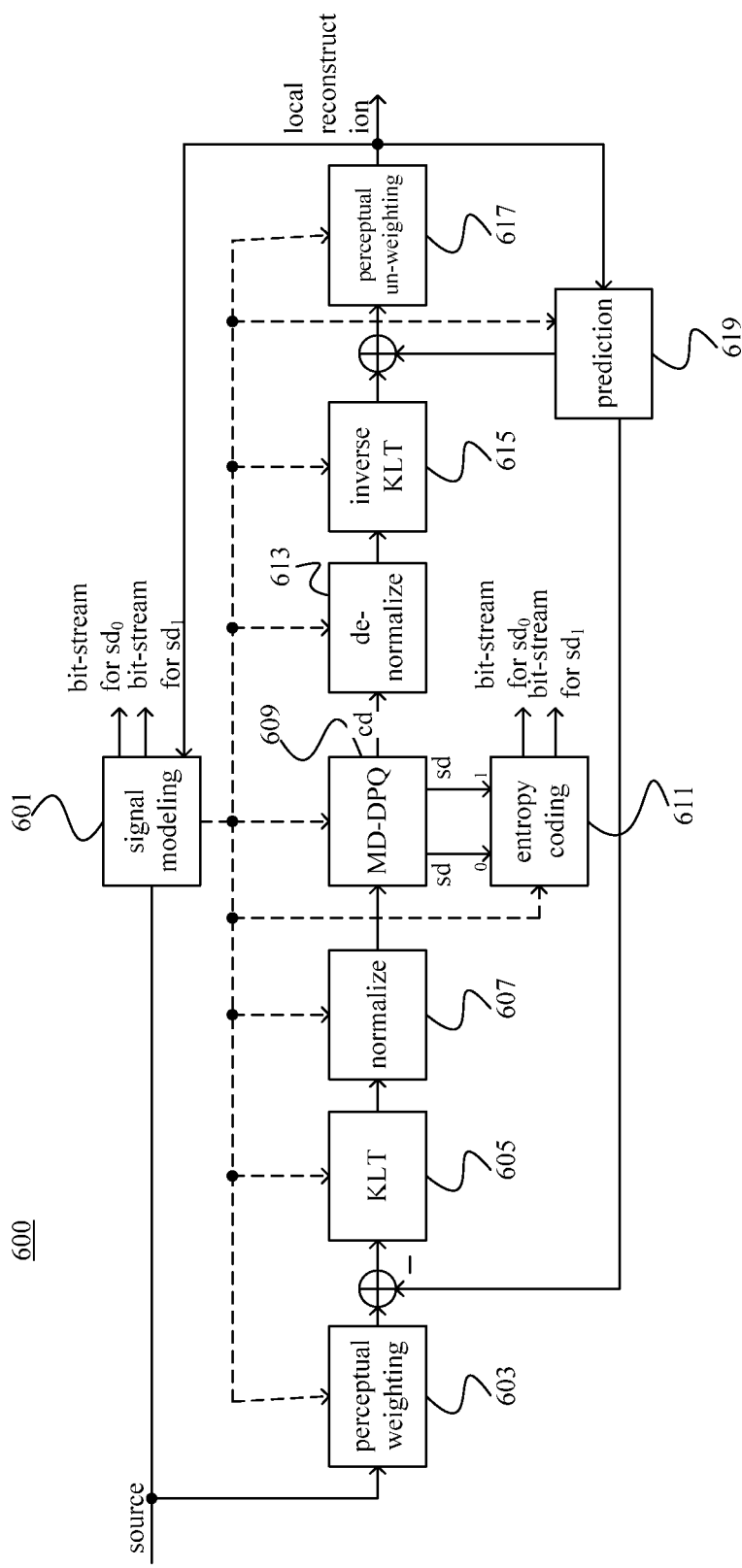
FIG. 6 shows an audio encoder according to an implementation form.

An exemplary application of the proposed MD-DPQ is in real-time audio communications over a network with packet losses. It is proposed to apply MD-DPQ in a forward-adaptive flexible coder that operates on mono wide-band signal. A high-level block diagram of such an audio encoder 600 is shown in FIG. 6.

The audio encoder 600 comprises a signal modeling block 601, a perceptual weighting block 603, a Karhunen-Loeve transformer (KLT) 605, a normalizer 607, an MD-DPQ 609, an entropy coder 611, a de-normalizer 613, an inverse KLT 615, a perceptual un-weighting block 617 and a predictor 619.

Coding is performed in a forward adaptive manner. Each block of the signal is modeled by a multivariate Gaussian in block 601. The covariance matrix is parameterized with an aid of an autoregressive (AR) model. Each signal block of 20 millisecond (ms) is subdivided into four sub-blocks and the AR model is interpolated for each sub-block. The AR model is used to obtain perceptual weighting and un-weighting filters.

A Karhunen-Loeve transform is computed on a sub-block basis in block 605. The KLT is applied to the perceptually weighted signal, which is provided by block 603, with a subtracted prediction, which is provided by predictor 619. The KLT coefficients are normalized in block 607 and quantized in block 609 using MD-DPQ yielding a block of reconstructed values of the central quantizer, shown as "cd", and two sets of indices for the two descriptions, shown as "sd0" and "sd1". The indices are encoded using two separate instances of the arithmetic entropy coder 611 and embedded into two packets. Each packet contains full information about the AR model and gains for signal normalization.

Only the reconstruction obtained from the central quantizer is used at the encoder to close the prediction loop provided by predictor 619. Local reconstruction is performed in blocks 613, 615 and 617, which, in general, provide an inverse operation to the blocks 603, 605, 607.

The decoder comprises the MD-DPQ decoder that provides signal reconstruction depending on the number of received descriptions, as described above. Accordingly, if both descriptions are received, the central reconstruction is performed. If one of the descriptions is lost, an appropriate side decoder is selected and a reconstruction is performed. If all the descriptions are lost, a statistical signal model for the previously received block is used to perform signal synthesis.

A heuristically decay factor may be chosen for the gains, e.g. 0.95, that renders a fade-out of the signal if the transmission is interrupted. The coding is performed on signal frames e.g. having a length of 20 ms. Every 20 ms, two side descriptions are generated. The side descriptions are two-stage. One stage contains full model information, e.g. linear prediction coefficients (LPC; used to represent the AR model) and four signal gains. The other stage contains signal description obtained from MD-DPQ. The bit-stream of the side description is obtained from an entropy coder 611.

A constant step size Δ is used for all transform coefficients, which can be motivated to be optimal by a high-rate argument. Each two-stage side description is transmitted using a single packet, and for a single frame of a signal, two packets are generated. The construction of packets leads to duplication of model information. The total available bitrate may be distributed symmetrically between the two packets.

The audio encoder 600 with MD-DPQ is flexible and can operate at any bitrate. It means that for any total bitrate constraint, the available bitrate may be distributed between the model and the signal part of the description. A constant model bitrate may be used, which is a desirable strategy for the flexible multiple description quantization.

What is claimed is:

1. A method for reconstructing a source signal, which is encoded by a set of at least two descriptions, the source signal having a first probability density, wherein the first probability density comprises a first statistical moment and a second statistical moment of the first probability density, the method comprising:

receiving a subset of the set of descriptions;

reconstructing a reconstructed signal at an operating bitrate of a set of operating bitrates upon the basis of the subset of descriptions, the reconstructed signal having a second probability density, wherein the second probability density comprises a first statistical moment and a second statistical moment of the second probability density; and manipulating the reconstructed signal in order to obtain a manipulated reconstructed signal having a third probability density, wherein the third probability density comprises a first statistical moment and a second statistical moment of the third probability density, wherein the reconstructed signal is manipulated such that at least the first statistical moment and the second statistical moment of the third probability density are more similar to the first statistical moment and the second statistical moment of the first probability density than the first statistical moment and the second statistical moment of the second probability density are, and wherein the reconstructed signal is manipulated such that, irrespective of the operating bitrate, a predetermined minimum similarity between the first statistical moment of the third probability density and the first statistical moment of the first probability density and between the second statistical moment of the third probability density and the second statistical moment of the first probability density is maintained.

2. The method according to claim 1, wherein the first statistical moment and the second statistical moment of the second probability density are manipulated to preserve the first statistical moment and the second statistical moment of the first probability density within a predetermined moment range.

3. The method according to claim 1, wherein the first statistical moments of the first probability density and the third probability density are about equal, and wherein the second statistical moments of the first probability density and the third probability density are about equal.

4. The method according to claim 1, wherein the reconstructed signal is reconstructed using a reconstruction function that is dependent on a composition of descriptions in the subset of descriptions.

5. The method according to claim 1, wherein the source signal comprises an additive dither signal, and wherein the reconstructing comprises subtracting the dither signal from the reconstructed signal.

6. The method according to claim 1, wherein the source signal comprises a pseudorandom dither signal, and wherein the reconstructing comprises subtracting the pesudorandom dither signal from the reconstructed signal.

7. The method according to claim 1, wherein the reconstructing comprises using an index assignment scheme, which is addressed by the descriptions of the set of descriptions, the index assignment scheme being used for deriving the set of descriptions encoding the source signal.

8. The method according to claim 1, wherein the manipulating the reconstructed signal comprises transforming the reconstructed signal according to a statistical transformation function, the transformation function being dependent on a composition of descriptions in the subset of descriptions.

9. The method according to claim 1, wherein the manipulating the reconstructed signal comprises transforming the reconstructed signal according to a statistical transformation function T(x), the transformation function T(x) being defined according to the following formula:

$$T(x) = F_X^{-1}\left\{\frac{1}{\Delta}\int_{\frac{\Delta}{2}}^{\frac{\Delta}{2}} F_X(x-\tau)d\tau\right\},$$

where Δ is a quantizer step size, $F_X(x)$ is the cumulative distribution function of variable X that is related to the probability density function $f_X(\cdot)$ of the first probability density, as $$F_X(x) = \int_{-\infty}^{x} f_X(\tau)d\tau,$$

and $F_X^{-1}(\cdot)$ denotes the inverse cumulative distribution function.

10. The method according to claim 1, wherein the manipulating the reconstructed signal comprises transforming the reconstructed signal according to a statistical transformation function T(x), the transformation function T(x) being defined according to the following formula:

$$T(x) = \sqrt{\frac{\sigma_X^2}{\sigma_X^2 + \frac{\Delta^2}{12}}}\, x,$$

where Δ is a quantizer step size, and $$\sigma_X^2 = \int_{-\infty}^{\infty} x^2 f_X(x)dx$$

is the variance of variable X that is related to the probability density function $f_X(\cdot)$ of the first probability density.

11. The method according to claim 1, wherein the manipulating the reconstructed signal comprises transforming the reconstructed signal according to a statistical transformation function T(x), the transformation function T(x) being defined according to the following formula:

$$T(x) = F_X^{-1}\left\{ \frac{1}{2M\Delta} \sum_{i \in P(M)} \int_{\Delta_l(i)}^{\Delta_r(i)} F_X(x-\tau) d\tau \right\},$$

where $\Delta$ is a quantizer step size, M is an index assignment parameter, $F_X(x)$ is the cumulative distribution function of variable X that is related to the probability density function $f_X(\cdot)$ of the first probability density, as $$F_X(x) = \int_{-\infty}^{x} f_X(\tau) d\tau,$$

$F_X^{-1}(\cdot)$ denotes the inverse cumulative distribution function, and P(M) is an index assignment pattern of an index assignment scheme being used for deriving the set of descriptions encoding the source signal, $$\Delta_l(i) = -(i-\overline{P})\Delta - \frac{\Delta}{2} \text{ and } \Delta_r(i) = -(i-\overline{P})\Delta + \frac{\Delta}{2}, \text{ with } \overline{P} = \frac{1}{2M} \sum_{i \in P(M)} i.$$

12. The method according to claim 1 wherein the manipulating the reconstructed signal comprises transforming the reconstructed signal according to a statistical transformation function T(x), the transformation function T(x) being defined according to the following formula:

$$T(x) = \sqrt{\frac{\sigma_X^2}{\sigma_X^2 + \frac{\Delta^2 M^4}{3}}} x,$$

where $\Delta$ is a quantizer step size, M is an index assignment parameter and $$\sigma_X^2 = \int_{-\infty}^{\infty} x^2 f_X(x) dx$$

is the variance of variable X that is related to the probability density function $f_X(\cdot)$ of the first probability density.

13. A decoder for reconstructing a source signal, which is encoded by a set of at least two descriptions, the source signal having a first probability density, wherein the first probability density comprises a first statistical moment and a second statistical moment of the first probability density, the decoder comprising:
an input for receiving a subset of the set of descriptions;
a reconstructor for reconstructing a reconstructed signal at an operating bitrate of a set of operating bitrates upon the basis of the subset of descriptions, the reconstructed signal having a second probability density, wherein the second probability density comprises a first statistical moment and a second statistical moment of the second probability density; and
a transformer for manipulating the reconstructed signal in order to obtain a manipulated reconstructed signal having a third probability density,
wherein the third probability density comprises a first statistical moment and a second statistical moment of the third probability density,
wherein the transformer is configured to manipulate the reconstructed signal such that at least the first statistical moment and the second statistical moment of the third probability density are more similar to the first statistical moment and the second statistical moment of the first probability density than the first statistical moment and the second statistical moment of the second probability density are, and
wherein the transformer is furthermore configured to manipulate the reconstructed signal such that, irrespective of the operating bitrate, a predetermined minimum similarity between the first statistical moment of the third probability density and the first statistical moment of the first probability density and between the second statistical moment of the third probability density and the second statistical moment of the first probability density is maintained.

14. The decoder of claim 13, wherein the transformer is configured to manipulate the first statistical moment and the second statistical moment of the second probability density in order to preserve the first statistical moment and the second statistical moment of the first probability density within a predetermined moment range.

15. The decoder of claim 13, wherein the reconstructor comprises a central reconstruction path, which is configured to reconstruct the reconstructed signal upon the basis of index information, the central reconstruction path comprising an indexer configured to determine the index information upon the basis of the set of descriptions.

16. The decoder of claim 13, wherein the reconstructor comprises a central reconstruction path, which is configured to reconstruct the reconstructed signal upon the basis of unique index information, the central reconstruction path comprising an indexer configured to determine the unique index information upon the basis of the set of descriptions.

17. The decoder of claim 13, wherein the reconstructor comprises at least one side reconstruction path, which is configured to reconstruct the reconstructed signal upon the basis of mapping information, the at least one side reconstruction path comprising a mapper configured to determine the mapping information upon the basis of the descriptions of the subset and of a composition of descriptions in the subset.

18. The decoder of claim 13, wherein the transformer is configured to perform the manipulating upon the basis of a composition of descriptions in the subset of descriptions.

19. At least one processor configured to reconstruct a source signal, which is encoded by a set of at least two descriptions, the source signal having a first probability density, wherein the first probability density comprises a first statistical moment and a second statistical moment of the first probability density, by:
receiving a subset of the set of descriptions;
reconstructing a reconstructed signal at an operating bitrate of a set of operating bitrates upon the basis of the subset of descriptions, the reconstructed signal having a second probability density, wherein the second probability density comprises a first statistical moment and a second statistical moment of the second probability density; and
manipulating the reconstructed signal in order to obtain a manipulated reconstructed signal having a third probability density, wherein the third probability density comprises a first statistical moment and a second statistical moment of the third probability density, wherein the reconstructed signal is manipulated such that at least the first statistical moment and the second statistical moment of the third probability density are more similar to the first statistical moment and the second statistical moment of the first probability density than the first statistical moment and the second statistical moment of the second probability density are, and wherein the reconstructed signal is manipulated such that, irrespective of the operating bitrate, a predetermined minimum similarity between the first statistical moment of the third probability density and the first statistical moment of the first probability density and between the second statistical moment of the third probability density and the second statistical moment of the first probability density is maintained.

20. The processor according to claim 19, wherein the first statistical moment and the second statistical moment of the second probability density are manipulated to preserve the first statistical moment and the second statistical moment of the first probability density within a predetermined moment range.

* * * * *